United States Patent
Waschura et al.

(10) Patent No.: US 7,301,325 B2
(45) Date of Patent: Nov. 27, 2007

(54) METHOD AND APPARATUS FOR CREATING PERFORMANCE LIMITS FROM PARAMETRIC MEASUREMENTS

(75) Inventors: Thomas E. Waschura, Menlo Park, CA (US); James R. Waschura, Menlo Park, CA (US)

(73) Assignee: Synthesys Research, Inc., Menlo Park, CA (US)

( * ) Notice: Subject to any disclaimer, the term of this patent is extended or adjusted under 35 U.S.C. 154(b) by 0 days.

(21) Appl. No.: 11/089,555

(22) Filed: Jan. 21, 2005

(65) Prior Publication Data

US 2005/0222798 A1    Oct. 6, 2005

(51) Int. Cl.
*G01R 31/26* (2006.01)
(52) U.S. Cl. .................. 324/158.1; 324/765; 324/73.1
(58) Field of Classification Search ...................... None
See application file for complete search history.

(56) References Cited

U.S. PATENT DOCUMENTS

| | | | |
|---|---|---|---|
| 5,343,405 A * | 8/1994 | Kucera et al. ................. | 702/73 |
| 5,949,798 A * | 9/1999 | Sakaguchi ................... | 714/738 |
| 6,118,294 A * | 9/2000 | Umeda ........................ | 324/765 |
| 6,246,248 B1 * | 6/2001 | Yamagishi ................... | 324/763 |
| 6,414,507 B1 * | 7/2002 | Hanajima .................... | 324/765 |
| 6,528,985 B1 * | 3/2003 | Greuel et al. ............. | 324/158.1 |
| 6,766,485 B1 * | 7/2004 | Sakaguchi ................... | 714/724 |
| 6,812,724 B2 * | 11/2004 | Rao et al. ................... | 324/763 |
| 6,815,969 B2 * | 11/2004 | Yagi ........................... | 324/765 |
| 2003/0117163 A1 * | 6/2003 | Nishimura .................. | 324/765 |
| 2003/0210069 A1 * | 11/2003 | Kikuchi et al. ............. | 324/765 |

\* cited by examiner

*Primary Examiner*—Minh N. Tang

(57) ABSTRACT

A measurement device includes a measurement circuit that generates a parametric measurement data signal including parametric characteristics of an input signal. In an exemplary embodiment, the parametric characteristics are measured at predetermined increments of time. A population limit analyzer is coupled to the measurement circuit and generates limit data in response to the parametric measurement data signal. A measurement limit checker is coupled to the population limit analyzer and generates a signal indicating that the characteristics of the parametric measurement data signal is within acceptable limits. With this information, the user is able to quickly grade a selected device under test (DUT). A device performance measurement method includes receiving an input signal. Next, statistical characteristics are determined from the parametric measurements of the input signal. Performance limits are extrapolated from the statistical characteristics of the parametric measurements. Then, a determination is made as to whether the parametric measurements are within the extrapolated performance limits.

17 Claims, 3 Drawing Sheets

METHOD AND APPARATUS FOR CREATING PERFORMANCE LIMITS FROM PARAMETRIC MEASUREMENTS

BACKGROUND OF THE INVENTION

1. Field of the Invention

The present invention generally relates to electronic measurement of selected devices under test (DUT)and, more particularly, to measuring selected parameters for various devices using communications link eye diagrams for setting limits to determine whether the DUT performance is satisfactory.

2. Description of the Related Art

When testing communications systems and components as well as other types of systems, it is common practice to set limits for the parameters to be measured. The performance of the DUT results in its parameters being determined by the test. The results found by testing are then compared to the desired limits to determine whether the measured performance is acceptable or not. Devising what limits to use is often part of a specification for standards compliance or the result of knowing the system's desired performance and adding additional manufacturing margin for known variations.

For example, in modern eye diagram mask testing, measurements of the voltage of a multi-valued bit stream versus time are compared to the set region limits to determine whether the voltage sample taken indicates that the voltage of the multi-valued bit was acceptable or not. In this case, if any measured voltages fall outside the defined limit region, then the DUT fails the multi-valued bit stream mask test.

As an additional example, measurements of a single parameter such as the rise time of a multi-valued bit stream signal is compared to a limit such that a visual or audible alarm may be used to signal an "out-of-specification" condition for the rise time of the signal.

Related art in this field includes devices such as digital and sampling oscilloscopes, bit error rate testers and error performance analyzers from companies such as Tektronix, Agilent Technologies, LeCroy Corporation. In at least some of these instruments, measured parameters of the DUT are compared to desired limits to determine whether the measured performance is acceptable. However, none of these instruments or any known instrument analyzes the statistics of the DUT measured performance parameters. Nor does any know device, instrument or system use the performance statistics and the data derived therefrom to extrapolate the expectancy of future performance as measured by the DUT's parameters after test. It is believed that such a collection of statistical information is of vital importance in manufacturing and design of such DUT. Using such information limits can be automatically discovered and used for comparison and/or saved for future use.

SUMMARY OF THE INVENTION

An object of the present invention is to measure the parameters of a device under test and to use those performance results to predict the limit of the selected parameter such that a known error or exception rate would be obtained.

Another object of the present invention is to be able to use one, two and multi-dimensional parametric measurement domains and to predict error or exception rate in these cases to be used to create one, two or multi-dimensional limit templates.

Yet another object of this invention is to save the learned one, two or multi-dimensional limit templates for later recall and re-use when testing parameters of other devices-under-test.

Eye mask and other multi-valued data stream parametric tests are commonly used in production to assure interoperability of individual components in a system. As long as a particular component in a system passes the mask/limit test defined for that type of component at that point in the system, the total system is assured to work when it is assembled. Mask tests are traditionally rough two-dimensional polygons that attempt to define the minimum allowable requirement for measured voltage sample parameters in the x/y axis domain where x is the time axis and y is the voltage or optical power axis. The points on eye diagram mask test polygons are hotly debated in technical committees as each point impacts the manufacturer of the component in different ways. A more lenient mask makes manufacturing easier. For example, the height of a mask impacts the amount of voltage or optical power noise or ripple allowed on signals; the width of the mask impacts the amount of jitter allowed on the signal. The angles at the left and right portions of masks often impact the rise/fall time of the system.

Exact analogies hold true for other parameter limit tests (including ones that are only one-dimensional) where measured results are compared to limits that define if the measured parameter is acceptable or not. Stricter limits are harder to maintain and lead to greater waste. More lenient limits allow more components to be graded as "acceptable". It would be advantageous to allow more lenient limits while maintaining the necessary quality level. It is therefore an urgent need in the industry to develop standards that are more relevant to allow for such improvements in manufacturing.

As described, industry-provided mask or limit tests define performance at various positions within a system. For example, they will define an eye diagram mask limit template at the output of a multi-level bit stream data transmitter. They will also define an eye diagram mask limit template at the input to the receiver. A manufacturer, however, also performs eye diagram mask limit tests at sub-components levels creating observability of the eye diagram quality at finer granularity than the system-oriented tests defined by an industry committee. At these points, a manufacturer will not want to test with the system-wide limit templates as they must still provide various margins to allow for the rest of the manufacturing and installation process.

It is common for components themselves to have very typical behavior and that any deviation from this behavior is a sign of a manufacturing defect or problem. In this way, measurements made on a golden device can be used to create a limit template for what type of parametric performance (e.g. eye diagram limit template or other parametric limit) should be typical to a device. This could be done by hand; however, what one would be trying to do manually is to create a limit boundary at a constant error rate. A major significance of this invention, then, is the automatic creation of a template limit mask based on an anticipated exception rate.

Therefore, it is an object of the present invention to measure parameters of a device under test and use those measurements to predict where a limit should be placed for the parameter such that a known error or exception rate would be predicted when using this limit.

Another object of the present invention is to be able to use one, two and multi-dimensional parametric measurement domains and to predict error or exception rate in these cases to be used to create one, two or multi-dimensional limit templates.

Yet another object of the present invention is to save the learned one, two or multi-dimensional limit templates for later recall and re-use when testing parameters of other devices-under-test.

The aforementioned objects and related advantages are provided by an electronic measurement device including a measurement circuit that generates a parametric measurement data signal including parametric characteristics of an input signal. In an exemplary embodiment, the parametric characteristics are measured at predetermined increments of time. A population limit analyzer is coupled to the measurement circuit and generates limit data in response to the parametric measurement data signal. A measurement limit checker is coupled to the population limit analyzer and generates a signal indicating that the characteristics of the parametric measurement data signal is within acceptable limits.

A device performance measurement method includes receiving an input signal from a device under test. Next, statistical characteristics, for example, root mean square, standard deviation, mean and other suitable characteristics or combination thereof are determined from parametric measurements of the input signal. Performance limits are extrapolated from the statistical characteristics of the parametric measurements. Then, a determination is made as to whether the parametric measurements are within the extrapolated performance limits.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein:

FIG. 3 is a graph showing the population distribution of the parametric measurements and limits computed there from;

DETAILED DESCRIPTION OF THE INVENTION

Figure 1:
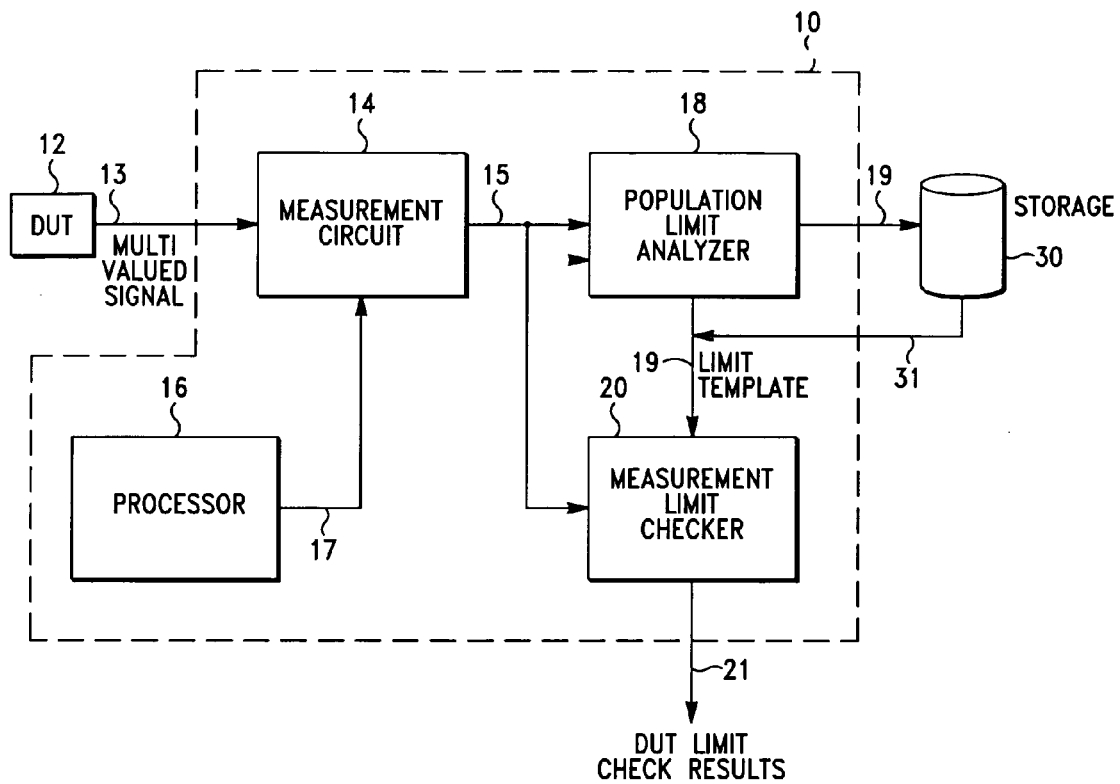
FIG. 1 illustrates a block diagram of one embodiment of the present invention.

The present invention will now be described in greater detail with reference to FIGS. 1-5, in which the preferred embodiments of the invention are shown. The present invention may, however, be embodied in many different forms and should not be construed as limited to the embodiments set forth herein; rather these embodiments are provided so that this disclosure will be thorough and complete and will fully convey the invention to those skilled in the art.

The disclosed method and apparatus uses measurements taken with a measurement system on a multi-valued signal coming from a device under test in order to compute one-, two- or multi-dimensional limits for future measured parameters so that assessment of the parameter of DUT's performance falling inside or outside the limits can be made. These computed one-, two- or multi-dimensional limits are based on using the population of measured parameters with possible extrapolation to determine where the limits must be set in order to achieve a pre-defined expectation for future parametric measurements to fall within the limits.

Further, the computed limits may be saved and recalled by a processor to/from a storage device for use in comparing measured parameters from other devices under tests to the computed limits from another device under test.

Measurements of multi-valued signals may include any type of parametric measurement of a multi-valued signal characteristic. This may include but is not limited to industry-standard parametric measurements such voltage, rise times, fall times, overshoot, undershoot, pre-shoot, jitter, amplitude, vertical eye closure penalty, optical modulation amplitude, extinction ratio, q-factor, eye signal-to-noise ratio, eye opening amplitude, eye opening time, crossing point, and bit error rate. Various measurements are often performed with different configuration settings (such as 10% to 90% rise/fall times or 20% to 80% rise fall times) and are computed in user-selectable units (such as volts or watts) and are tallied with familiar statistical significances (such as average, median, RMS and peak-to-peak) and the exemplary embodiment of the present invention anticipates that all such measurement configurations, units and tallies are equally suited for use as measured parameters whose measured populations can be used to determine pre-defined limits using an exemplary measurement device that operates in accordance with the present invention.

Measurement devices that measure parameters of multi-valued signals coming from devices under test include but are not limited to bit error rate testers, oscilloscope devices (including but not limited to digital sampling oscilloscopes, digitizing "deep memory" oscilloscopes, analog oscilloscopes), jitter analyzers and any other measurement instrument or device that makes parametric measurements on multi-valued signals.

One-dimensional limits may include, but are not limited to, an acceptable upper and lower bound of a parameter such as rise times, fall times, overshoot, undershoot, pre-shoot, jitter, amplitude, vertical eye closure penalty, optical modulation amplitude, extinction ratio, q-factor, eye signal-to-noise ratio, eye opening amplitude, eye opening time, crossing point, and bit error rate where the single-valued parameter is tested to see if its value is between the upper and lower measurement limit to know if it is acceptable or not.

Two-dimensional limits may include, but are not limited to, eye diagram mask tests where the sampled parameter of voltage of the multi-valued signal taken at different time offsets within the bit period of the multi-valued signal are compared to one or more two-dimensional limit regions in the sampled voltage vs. time offset within the bit period domain. The status of the sampled parameter and it's associated time offset determines if the measured parameter of voltage is acceptable or not. For example, if a sampled voltage and its associated time offset are within predetermined limits, the sample and thus the DUT will determined as functioning in an acceptable manner.

Multi-dimensional limits may include, but are not limited to, limits where parametric measurements are made on more than two axes. Limits of this type may include, but are not limited to, parameters of multi-valued signals from devices under test that may be measured while temperature is changed, vibration is applied, distortion is inserted or any other mechanism that may impact the performance of the measured parameter such that different measured parametric populations might exist and therefore need to be considered when computing limits of the measured parameter.

A population of measured parameters is a well-understood statistical distribution of the number of occurrences of measurements versus the measurement result. If all measurements are identical, then the measured population shows that all measurement occurrences have the same measurement value. If there is a random distribution of measurement value results distributed with some standard deviation, then the measurement population would show a Gaussian distribution of the measurement parametric values versus the number of occurrences where the standard deviation would define the width of the gaussian result. Any type of distribution may be present in a population including, but not limited to, random distribution, sinusoidal distribution, triangular distribution, Poisson distribution, bi-modal distribution and equal-probability distribution.

Extrapolation of a population of measured parameters includes well-understood numerical method techniques that allow curve-fitting and extrapolating in between and beyond actual measured data points. In this way, well-understood and generically applied curve-fits are performed to devise a continuous function representing the population distribution. This function, which represents the measured parametric population, can then be used to ascertain the expected population in areas where actual data measurements may not have been taken. The effectiveness of these curve-fit algorithms depends on the types of distributions being measured and well-understood methods can generically be applied to choose the best such curve-fitting approach for a given parametric measurement. All such curve-fitting approaches can equally be applied to an exemplary embodiment of the structure in accordance with this invention in order to compute a parametric limit.

Limits on a population or extrapolated population may include upper and lower bound values of the parameter which can be compared to any parameter with a simple mathematical comparison to determine if a measured parameter is in between the upper and lower bound values. Limits may be inclusive or exclusive meaning that acceptable bounds may be when parametric measurements fall inside the limits or acceptable bounds may be when parametric measurements fall outside the limits. Limits may include the actual limit value or may be just up to the limit value (as in the limit may be "less than" a number or "greater than" a number or the limits may be "less than or equal to" a number or "greater than or equal to" a number).

A pre-defined expectation of future parametric measurements of measured parameters is created by computing an upper and lower bound value of the parameter at which the well-understood integrated area under the curve representing the population distribution accounts for the pre-defined expectation ratio. This includes, but is not limited to, setting an expectation of 2-sigma (2.275%) failure rate or a 1 in 1,000,000,000,000 bit error rate.

Saving and restoring computed pre-defined one-, two- or multi-dimensional limits for measured parameters to/from a storage device includes but is not limited to means of representing the limits for measured parameters in digital or analog representations such that they can be stored onto a hard disk, floppy disk, memory card, non-volatile memory (EEPROM), random access memory, or any other type of analog or digital memory device and retrieved for later re-use. Later re-use may mean immediate re-use as in the same device under test is re-tested using the results of previous parametric measurements.

Using saved one-, two- or multi-dimensional limits computed from parametric measurements taken on one DUT and comparing parameters measured from another DUT includes, but is not limited to, comparing parametric measurements made on a device under tests to computed limits derived from measurements taken on another device under test or the same device under test during a different testing time. In this fashion, measurements made from the measurement circuit are provided to a limit check processing element which uses the previously computed limits as the boundaries to asses if the measured parameter is acceptable or not.

FIG. 1 shows a block diagram of an exemplary measurement device 10 that operates in accordance with the principles of the present invention. A device under test (DUT) 12 outputs a multi-valued signal 13 that is presented to a measurement circuit 14, for example, a signal analyzer, an oscilloscope, a dedicated piece of hardware (e.g. ASIC), state machine, one or more processors or other suitable devices or combination thereof. The measurement circuit 14 operates on this signal 13 and makes parametric measurements, for example, voltage amplitude and frequency characteristics of the input signal 13. The measurement circuit 14 in an exemplary embodiment may include a device that samples the voltage of the multi-valued signal 13 at various precise time increments. An alternate embodiment uses a measurement circuit 14 that measures the bit error rate of the multi-valued signal 13 from the device under test 12 at desired time-offset within the bit period in the data carried by the multi-valued signal 13 and voltage threshold within the amplitude range of the data carried by the multi-valued signal 13. Measurement circuits that measure bit error rate or that samples signal voltage at precise time increments are well understood measurement systems to anyone trained in the art of communications electronics.

A processor means 16, for example, one or more central processing units, dedicated hardware circuit, an application specific integrated circuit, state machine, software executing on one or more processors or other suitable devices or combinations thereof is used in this invention to, among other things, configure the measurement circuit 14 to make the appropriate measurement of interest via control line 17. Any measurement that has a population variation can be employed by this invention. The results of the measurement circuit 14 are presented to both the population limit analyzer 18 that gathers or otherwise collects all the parametric measurement data 15 and analyzes the statistics of the parametric measurements and the measurement limit checker 20, which may be implemented, for example, by a comparator circuit or other suitable device capable of measurement or otherwise comparing input signals.

The limit analyzer 18 studies the population of measurements to determine where a limit should be placed such that future additions to the population either fall on one side or the other side of the limit. One side would be good and the other would be bad. For instance, you might have a population of rise-time measurements and rise-times less than y psec would be good and greater/equal to y would be bad. The idea is that y can be set to define a certain failure rate based on the population distribution. To say it "studies the population" is a fancy way of saying that it looks at the distribution of samples (e.g. perhaps a bell-curve) so that it can pick a point on the curve that defines the limit of what is good and what is bad.

During the initial task of learning of the limit, the population of measurements are taken and a limit (i.e. a threshold on the population values) is determined to satisfy the desired failure rate. Once the limit is established, then the next task (checking future measurements against the limit and claiming a failure if appropriate) is done.

During the initial task of learning the measurement limits, the measurement checker 20 is not employed. Instead, during this first task, the measurements 15 are collected and analyzed by the population analyzer 18.

During the collection process, the measurements 15 are stored in the memory of the processor 16. A sufficient number of measurements must be collected into the population to enable the accuracy of the curve-fit process to be employed by the population limit analyzer 18. It is possible to only have two measurements in the population; however, it is preferred to have many more measurements in the population to get more accurate results.

In an exemplary embodiment, a computer data structure is used by the processor means 16 to accumulate the number of measurements 15 that occur at fixed measurement value increments—this is a histogram of the measurement values. The value of the increment amount is set by the resolution of the measurement circuit 14 and the desired resolution of the limit values. In an exemplary embodiment, the measurement circuit 14 is used to measure rise times of the data transitions in the multi-valued signal 13 coming from the device under test 12. The rise-times range from 20 to 30 picoseconds, so increments of 1 pico-second are used which creates 10 bins in the histogram of rise time measurements.

In an exemplary embodiment, two-dimensional populations are collected to form a two-dimensional histogram. This histogram displays the number of occurrences of the measurement of the voltage of the multi-valued signal 13 from the device under test 12 that occurs in both a particular instant in time (relative to the start of the bit period) and a particular voltage offset within the voltage range of interest. The population limit analyzer 18 in this embodiment uses the two-dimensional histogram data in the same fashion as the one-dimensional embodiment where one-dimensional slices through the two-dimensional array are extracted to create multiple, one-dimensional histograms that are all processed by the population limit analyzer 18 individually.

Processing many histograms is done just as a single histogram is done, where their resulting limits are valid for individual one-dimensional slices through the two-dimensional histogram. The output 19 of the population limit analyzers 18 is a set of limits for the given measurement. Through commands 17 issued by the processor means 16, the population limit analyzer 18 will create the limits 19 and store them in a memory means 30, for example, a ROM, RAM, CD-ROM, distributed memory over a network, or any suitable volatile or non-volatile memory or combination thereof, for later recall or will directly send them to a "measurement limit checker" processing element 20. The processor is also connected to the population limit analyzer 18, as shown. The processor controls the population limit analyzer 18 during setup and coordinates overall processing.

In another exemplary embodiment where measurements 15 are the rise times of a signal 13, the limits 19 are stored as the high and low value (rise time) limit number.

In another exemplary embodiment where the measurements 15 are the voltages of a multi-valued data signal level 13, the limits 19 are stored as a series of (x,y) points where x is the time offset within the bit period and y is the voltage offset in the voltage region of interest and the combined list of (x,y) points circumscribed the limit region or regions to be used. The "measurement limit checker" processing element 20 accepts the measurement limits 19 from the population limit analyzer 18 and measurements from the measurement circuit 14 and compares the measurement value 15 to the limit 19 to report on the check results. In an exemplary embodiment, the limit checking is accomplished by the measurement limit checker 20 comparing the measured rise time 19 to see if it is above the minimum rise time value and simultaneously below the maximum rise time signal. In this case, the measurement falls within the limits and the results of the measurement limit checker 20 reports that the limit is acceptable.

In another alternate embodiment, measurements of new voltages taken at various time offsets within the bit period by the measurement circuit 14 are compared to the regions defined by the limits 19 defined, for example, by the collection of (x,y) points that form limit boundaries to see if the new measurement 15 falls inside or outside the boundary. Specifically, for all samples taken at all time offsets within the bit period, the measured voltage is compared to the y-value voltage offsets for the same x-value time offsets. Measured voltages that are on the appropriate side of the limit as defined by the population collected and analyzed by the "one, two or multi-dimensional population limit analyzer", are then reported as acceptable.

These parametric measurements are presented to a population limit analyzer processing element 18 that gathers all the measurements 15 and analyzes the statistics, for example, the standard deviation, mean, root mean square of other suitable statistics or combinations thereof, of the measurements 15. According to the measurement population and the desired pre-defined expectation of parametric measurement failure whose limits are desired, this analyzing element 18 determines an upper and lower bound to the allowable parametric measurement. Determining such upper and lower bounds 19 are done by fitting a curve to the measured parametric population data, which represent the population of parametric measurements. The area under this curve is integrated between various upper and lower limits until upper and lower limits are found that result in an area under the parametric population curve that matches the pre-defined expectation of success and that is centered over the population density. It is possible to use well-understood extrapolation techniques to extend the range and resolution of the measured parameter statistics to compute parametric limits at the desired resolution or pre-defined expectation level as needed.

Figure 2:
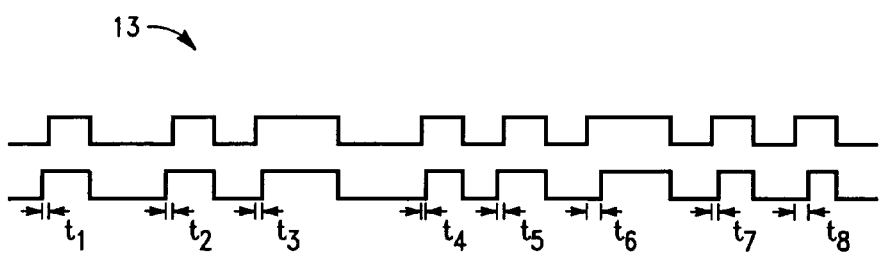
FIG. 2 is a timing diagram of a multi-valued bit stream showing numerous rise-time measurements taken on different rising edges in the timing diagram.

FIG. 2 shows a timing diagram of an exemplary multi-valued signal 13 coming from a device under test 12 as present to the measurement circuit 14. This example shows how multiple measurements of the rise-time ($t_0$-$t_8$) of the signal 13 may be made on various rising edges. Each measurement may have variation due to changes in the rise time of the multi-valued signal 13 at different positions within the bit stream or noise in the parametric measuring method. Many such measurements result in a population of measured parameters, $t_0$ through $t_n$, that are used by the population limit analyzer 18 to determine suitable parametric limits according to the pre-defined expectation of success/failure.

Figure 3:
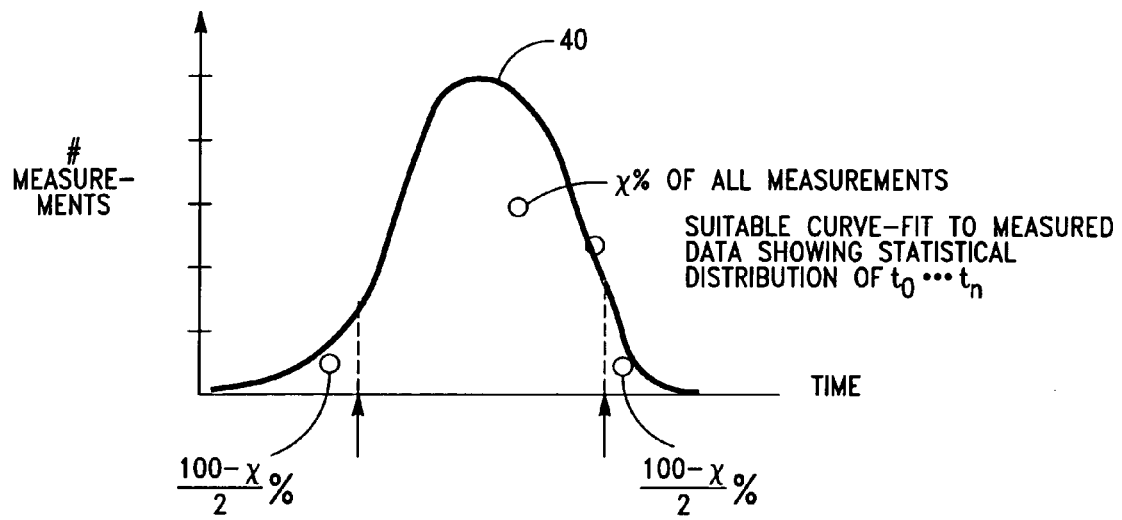

FIG. 3 shows a graph illustrating the population distribution 40 of the one-dimensional parametric measurements $t_0$ through $t_n$. This graph shows the number of measurements made that correspond to the entire range of parametric measurement values. All measurements, $t_0$ through $t_n$ are represented in the population. The population shown is a smoothly varying function that results from extrapolating measured parametric value population results using various and commonly-understood curve-fitting methods. The limits, A and B, in FIG. 3 are set based on integrating the area under the curve of population statistics such that the area equals the pre-defined expectation of success and the area of pre-defined expectation of failure is split between the area above the B threshold and below the A threshold. In this way, parametric measurements that fall between limits A and B will be expected to fail at a rate determined by the predefined expectation amount.

Figure 4:
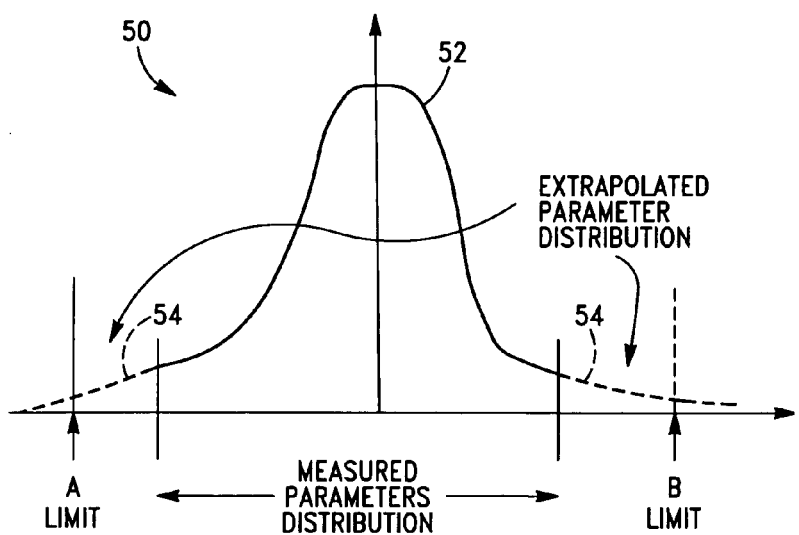
FIG. 4 is a graph demonstrating extrapolation of measured parametric distributions.

FIG. 4 shows a graph 50 that further illustrates how actual measured parametric distributions 52 are extrapolated using commonly-available and well-understood curve-fitting and other techniques to extend the range of parametric population statistics outside of the actual measurement range collected. For example, the population of voltage sample parameters at a given decision threshold in the multi-valued signal may be analyzed in a range of time offsets within a bit window that correspond to data jitter and that indicate the possibility of making errored bit decisions. In a relatively small number of parametric measurements, the shape of the population of voltage parametric statistics in this example can be gathered and used to predict the farther out in the distribution. In this example, the actual measurements 52 would correspond to the "measured parametric distribution" of FIG. 4 and predicting the distribution farther out would correspond to the extrapolated parametric distribution 54. Using the exemplary measurement device 10 (FIG. 1) in accordance with the present invention, it is possible to learn the expected limits of the voltage parametric measurements to a pre-defined expectation of error (bit error rate) that is outside of the actual measured statistic population by extrapolating actual measured populations. FIG. 4 clearly shows how limits A and B are in the region identified as "extrapolated parametric distribution".

Figure 5:
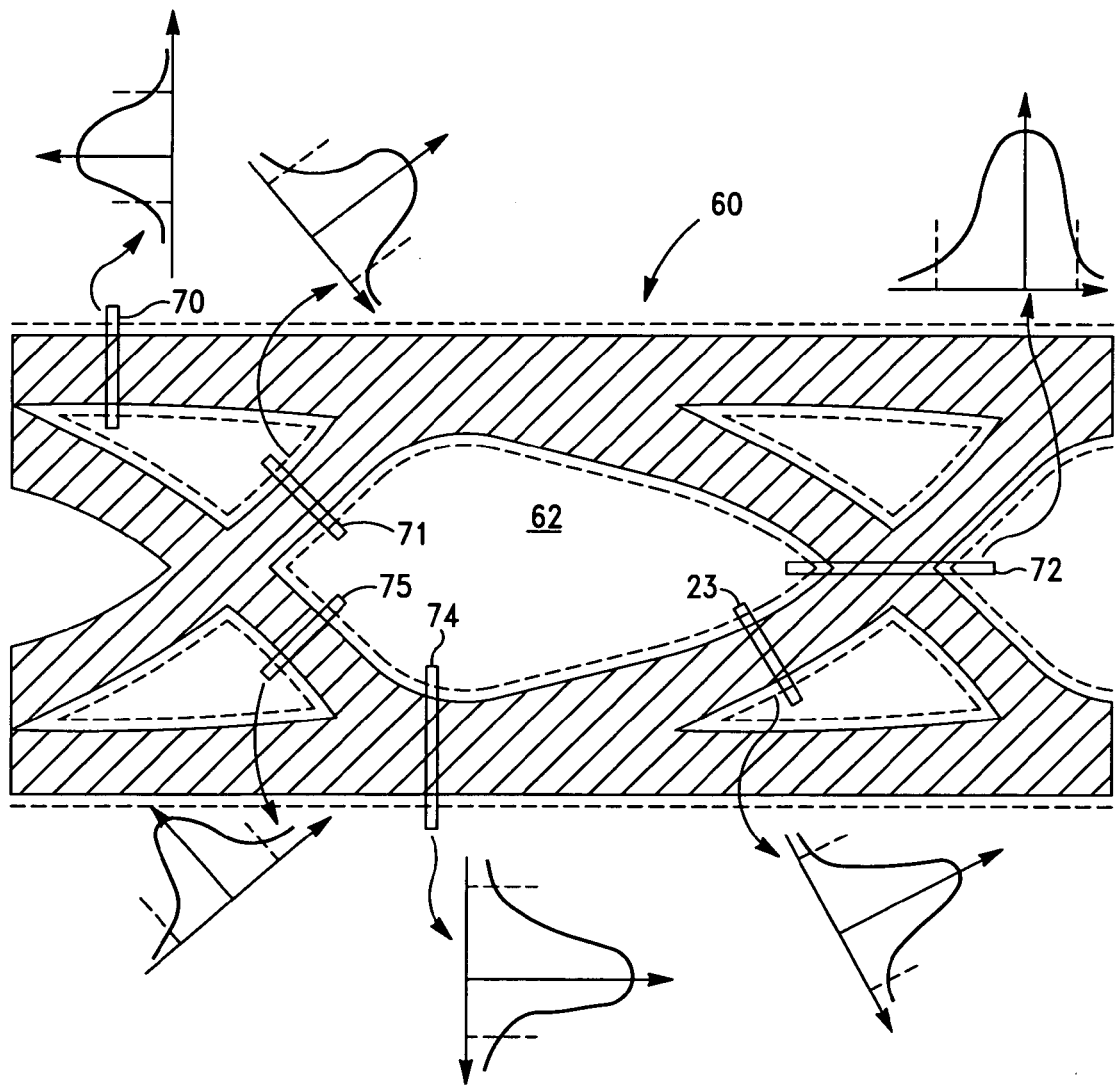
FIG. 5 illustrates two-dimensional parametric measurements and computed two-dimensional limits.

FIG. 5 illustrates two-dimensional parametric measurements and computed two-dimensional limits as provided by the measurement device of the present invention. In this figure, voltage parameter samples are taken at various time offsets within the bit period. This diagram, known as an eye diagram 60, illustrates a two-dimensional statistical distribution of the voltage parameter of the multi-valued signal coming from the device under test. In this figure, various slices 70-75 are shown which illustrate how parametric population measurements at various locations and tilts in the two-dimensional space have the same nature as the population parametric distribution 50 of FIG. 4, which can be extrapolated and which can have limits computed based on a pre-defined expectation of success. Successive slices 70-75 of this two-dimensional parametric population are then used to define neighboring limits and these neighboring limits together form the limit regions needed to identify success or failure of the parametric measurement to the level requested by the pre-defined expectation value. Limit regions may be used only in areas of concern and all possible limit regions may not be used. For instance, in the eye diagram 60, the areas of concern may only include the center eye opening area 62 as this area directly relates to making a wrong bit decision. Having a signal that is below the lowest limit bar 74 at the bottom of the diagram or above the highest limit bar 70 at the top of the diagram may have no impact on the overall performance of the device under test.

What is claimed is:

1. A measurement device, comprising:
   a measurement circuit operative to generate a parametric measurement data signal, including parametric characteristics of an input signal from a device under test, the parametric characteristics being measured at predetermined increments;
   a population limit analyzer operative to generate limit data in response to the parametric measurement data signal; and
   a measurement limit checker operative to generate an accept signal when the parametric measurement data signal has a characteristic within the limit data.

2. The measurement device of claim 1, wherein the measurement limit checker comprises a comparator, and the accept signal is generated based on a comparison of the parametric measurement data signal and the limit data.

3. The measurement device of claim 1, wherein the population limit analyzer collects the parametric measurement data signal and analyzes the statistics of the parametric measurement data signal.

4. The measurement device of claim 1, wherein the parametric characteristics include the group consisting of: voltage amplitude and bit error rate.

5. The measurement device of claim 1, wherein the predetermined increments further include desired time offsets within the bit period in data carried by the input signal.

6. The measurement device of claim 5, wherein the time offsets are provided by a control signal.

7. The measurement device of claim 6, wherein the control signal is generated by a processor.

8. The measurement device of claim 6, wherein the control signal is provided to the population limit analyzer and the measurement limit checker.

9. The measurement device of claim 1, further including a memory operative to maintain the limit data provided by the population limit analyzer.

10. A device performance measurement method, comprising:
    receiving an input signal from a device under test;
    determining statistical characteristics from parametric measurements of the input signal;
    extrapolating performance limits based on the determined statistical characteristics of the parametric measurements; and
    determining whether the parametric measurements are within the extrapolated performance limits.

11. The method of claim 10, wherein the parametric measurements comprises the voltage of the input signal during a predetermined bit period.

12. The method of claim 10, further comprising providing an indication of the performance of a device under test.

13. The method of claim 10, wherein determining whether the parametric measurements are within the extrapolated performance limits further includes comparing the parametric measurements to the performance limits.

14. The method of claim 10, further comprising determining an expectation of future parametric measurements in response to the extrapolated performance limits.

15. The method of claim 10, further comprising storing the extrapolated performance limits in memory.

16. The method of claim 15, further comprising comparing the stored performance limits to parametric measurements from a second device under test.

17. The method of claim 15, further comprising comparing the stored performance limits to parametric measurements of a device under test original provided performance during a different test time.

* * * * *